(12) United States Patent
Kim et al.

(10) Patent No.: US 11,489,416 B2
(45) Date of Patent: Nov. 1, 2022

(54) MOTOR CONTROLLER

(71) Applicant: MANDO CORPORATION, Gyeonggi-do (KR)

(72) Inventors: Ji Hwan Kim, Gyeonggi-do (KR); Joon Ho Jung, Gyeonggi-do (KR)

(73) Assignee: MANDO CORPORATION, Gyeonggi-Do (KR)

( * ) Notice: Subject to any disclaimer, the term of this patent is extended or adjusted under 35 U.S.C. 154(b) by 297 days.

(21) Appl. No.: 16/932,737

(22) Filed: Jul. 18, 2020

(65) Prior Publication Data
US 2021/0028673 A1 Jan. 28, 2021

(30) Foreign Application Priority Data

Jul. 22, 2019 (KR) .................. 10-2019-0088283

(51) Int. Cl.
| | | |
|---|---|---|
| *H02K 11/33* | (2016.01) | |
| *H02K 5/04* | (2006.01) | |
| *H02K 11/30* | (2016.01) | |
| *H02K 5/22* | (2006.01) | |
| *H02P 31/00* | (2006.01) | |
| *B60R 16/02* | (2006.01) | |
| *H05K 7/20* | (2006.01) | |

(52) U.S. Cl.
CPC .............. *H02K 11/33* (2016.01); *H02K 5/04* (2013.01); *H02K 5/225* (2013.01); *H02K 11/30* (2016.01); *B60R 16/0207* (2013.01); *H02P 31/00* (2013.01); *H05K 7/20409* (2013.01)

(58) Field of Classification Search
CPC ...... H05K 7/20409; H05K 7/209; H02K 5/04; H02K 11/33; H02K 5/225; H02K 221/03; H02K 11/30; H02K 11/0073; H02K 11/0084; H02K 11/048; H02K 5/22; H02P 29/00; H02P 31/00; B60R 16/0207; B62D 5/0406; B62D 5/04
USPC .................................................. 310/71, 68 R
See application file for complete search history.

(56) References Cited

FOREIGN PATENT DOCUMENTS

KR     10-0737135     7/2007

*Primary Examiner* — Alexander A Singh
(74) *Attorney, Agent, or Firm* — Ladas & Parry, LLP (57) ABSTRACT

A motor controller is disclosed. The motor controller according to one embodiment of the present invention comprises a first electronic control unit which comprises a first substrate and a first connector having a first identification member and coupled to the first substrate and controls a motor, a second electronic control unit which comprises a second substrate and a second connector having a second identification member different from the first identification member and coupled to the second substrate and controls the motor, and a first heat radiation member of which one surface is coupled to the first electronic control unit and the other surface is coupled to the second electronic control unit, and which comprises a first interference member formed at a position at which the first interference member is not interfered with by the first identification member but is interfered with by the second identification member such that the one surface is not coupled to the second electronic control unit and has a plate shape.

12 Claims, 8 Drawing Sheets

MOTOR CONTROLLER

CROSS-REFERENCE TO RELATED APPLICATION

This application claims priority to and the benefit of Korean Patent Application No. 10-2019-0088283, filed on Jul. 22, 2019, the disclosure of which is incorporated herein by reference in its entirety.

BACKGROUND

1. Field of the Invention

The present invention relates to a motor controller, and more specifically, to a motor controller disposed at one side of a motor to control driving of the motor.

2. Discussion of Related Art

Electronic control units (ECUs), which control rotating speeds or torques of motors and are separated from main ECUs, are provided in electric power steering (EPS) systems or the like of vehicles. Recently, packaging technology of integrally forming a motor and an ECU has been used.

In addition, in a trend in which the number of electronic systems of a vehicle is increased and fail/safety related regulations (ISO26262) are tightened, redundancy designs corresponding to the fail/safety related regulations are used. In order to apply redundancy design to control a motor, an additional ECU is required. This means that two ECUs should be disposed in a package.

Meanwhile, when two ECUs are used to control a motor according to a redundancy design, the ECUs should be installed at predetermined positions in consideration of being coupled to wiring harnesses. However, since shapes of substrates and connectors of the ECUs are similar, there is a probability that coupling positions of the ECUs will be changed. In a case in which the coupling positions of the ECUs are changed from each other, since the wiring harnesses do not match with the ECUs, there is a problem when the motor is controlled.

Accordingly, development of technology which prevents incorrect assembly is required which allows two ECUs included in a motor controller to be coupled at predetermined positions. In addition, securing spatial efficiency and reducing package size when the motor and the ECUs are packaged are also emerging as important technical challenges.

RELATED ART

[Patent Document]
Registered Patent No. 10-0737135 "MOTOR DRIVING ECU OF VEHICLES,"

SUMMARY OF THE INVENTION

The present invention is directed to providing a motor controller having a structure which allows incorrect assembly to be prevented such that two electronic control units are coupled at predetermined positions.

In addition, the present invention is also directed to providing a motor controller allowing a size of a package to be minimized due to high space efficiency.

According to an aspect of the present invention, there is provided a motor controller including a first electronic control unit which comprises a first substrate and a first connector having a first identification member and coupled to the first substrate and controls a motor, a second electronic control unit which comprises a second substrate and a second connector having a second identification member different from the first identification member and coupled to the second substrate and controls the motor, and a first heat radiation member of which one surface is coupled to the first electronic control unit and the other surface is coupled to the second electronic control unit, and which comprises a first interference member formed at a position at which the first interference member is not interfered with by the first identification member but is interfered with by the second identification member such that the one surface is not coupled to the second electronic control unit and has a plate shape.

The first identification member may be formed as a protrusion protruding toward the one surface of the first heat radiation member, and the first interference member may be formed as a protrusion formed on the one surface of the first heat radiation member.

The first identification member and the first interference member may be disposed close to each other side by side in a state in which the first electronic control unit is coupled to the one surface of the first heat radiation member.

The first heat radiation member may further comprise a second interference member formed at a position at which the second interference member is not interfered with by the second identification member but is interfered with by the first identification member such that the other surface is not coupled to the first electronic control unit.

The second identification member may be formed as a protrusion protruding toward the other surface of the first heat radiation member, and the second interference member may be formed as a protrusion formed on the other surface of the first heat radiation member.

The second identification member and the second interference member may be disposed close to each other side by side in a state in which the second electronic control unit is coupled to the other surface of the first heat radiation member.

The first heat radiation member may be disposed at a side, which is opposite to an output shaft, of the motor along a shaft extending in a longitudinal direction of the motor.

One end of the first substrate and one end of the second substrate may be disposed close to an end portion, which is opposite to the output shaft, of the motor, the first connector may be coupled to the other end of the first substrate, and the second connector may be coupled to the other end of the second substrate.

The motor controller may further comprise a second heat radiation member coupled to an end portion, which is opposite to the output shaft, of the motor and connected to the first heat radiation member.

The second heat radiation member may be formed to have an annular shape.

The first substrate may comprise a first power circuit, the second substrate may comprise a second power circuit, and the first heat radiation member may comprise a first contact portion formed to protrude from the one surface in contact with the first substrate to be in contact with the first power circuit and a second contact portion formed to protrude from the other surface in contact with the second substrate to be in contact with the second power circuit.

The first contact portion and the second contact portion may be formed so that at least a part does not overlap when viewed in a perpendicular direction.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, embodiments of the present invention will be described in detail with reference to the accompanying drawings in order for those skilled in the art to easily perform the present invention. The present invention may be implemented in several different forms and is not limited to the embodiments described herein. Parts irrelevant to the description will be omitted in order to clearly describe the present invention, and the same or similar parts are denoted by the same reference numerals throughout this specification.

It should be understood that the terms "comprise," "comprising," "include," and/or "including," when used herein, specify the presence of stated features, numbers, steps, operations, elements, and/or components, but do not preclude the presence or addition of one or more other features, numbers, steps, operations, elements, components, and/or groups thereof.

Figure 1:
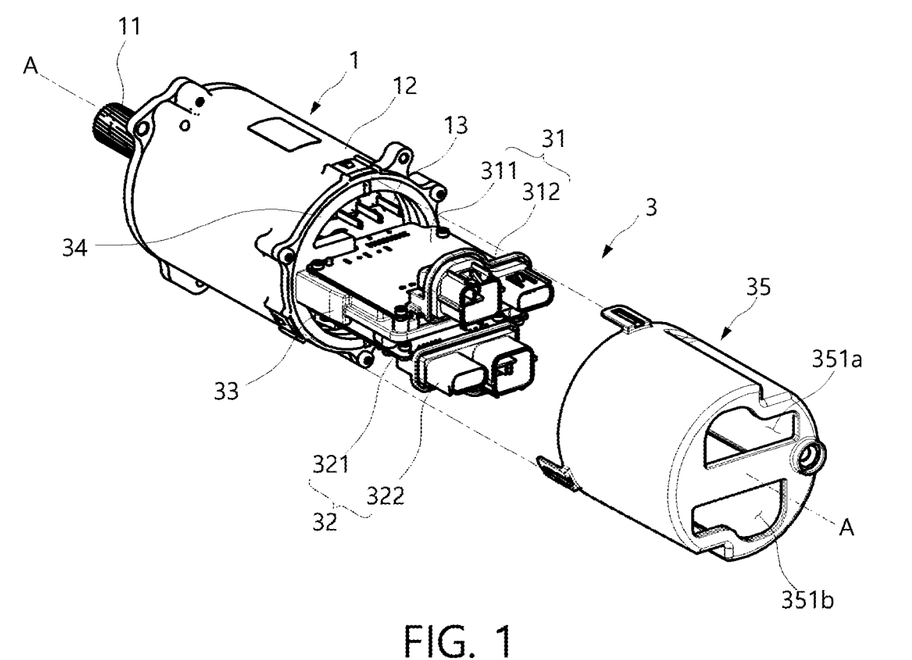
FIG. 1 is a perspective view illustrating a state in which a cover is separated from a motor package including a motor controller according to one embodiment of the present invention.
Figure 2:
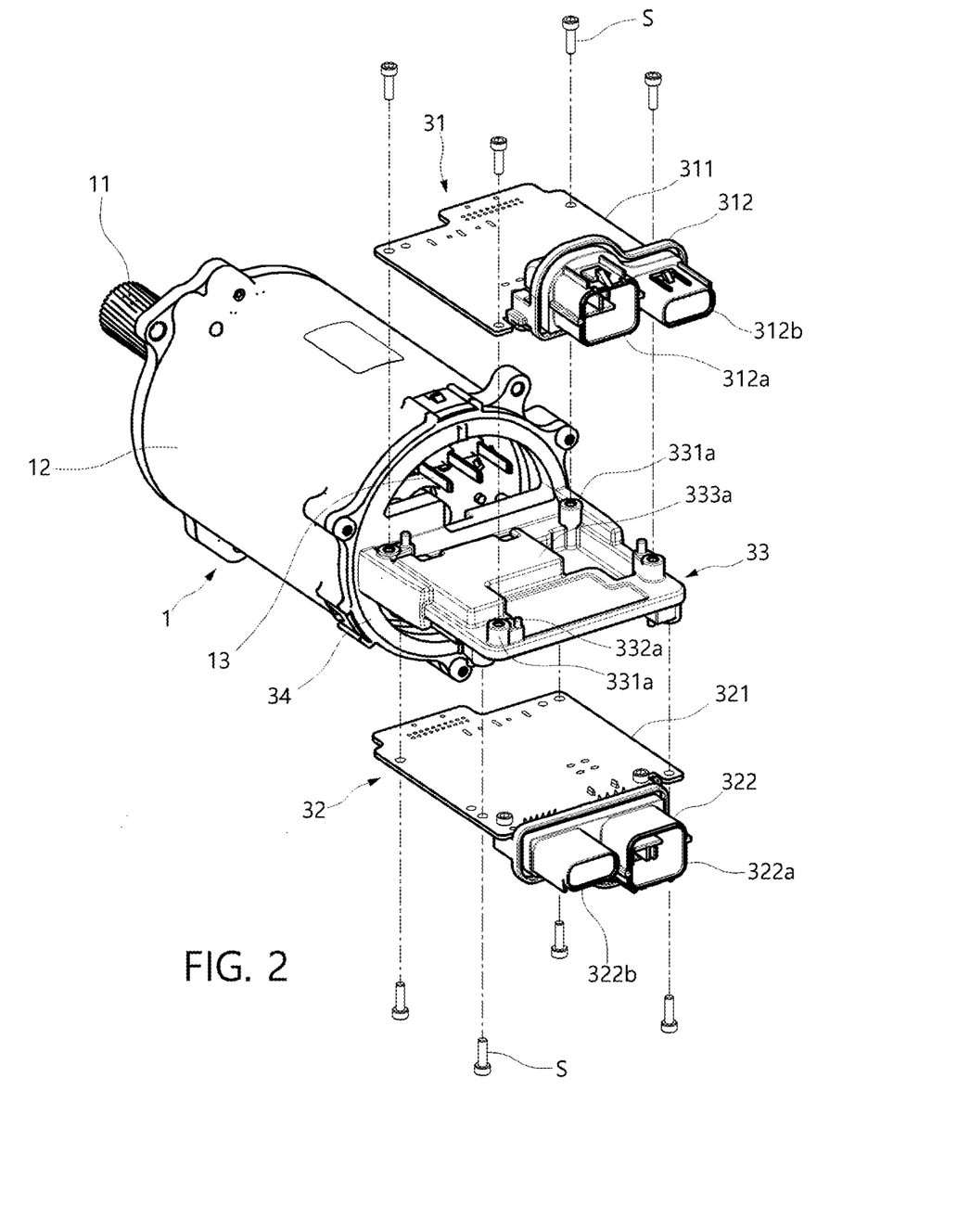
FIGS. 2 and 3 are perspective views illustrating a state in which a first electronic control unit (ECU) and a second ECU, which are included in the motor controller according to one embodiment of the present invention, are separated when viewed from different angles.
Figure 3:
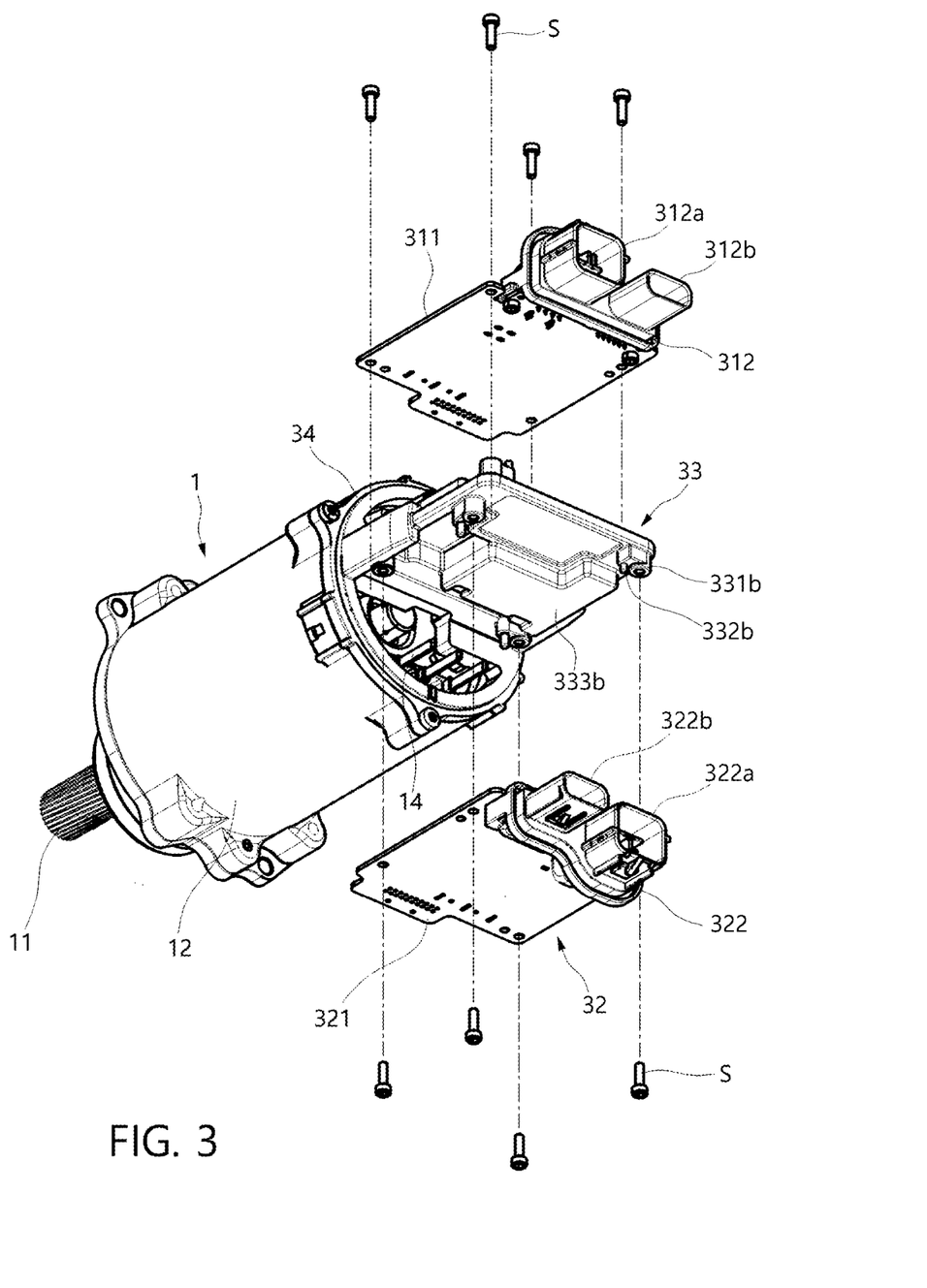

FIG. 1 is a perspective view illustrating a state in which a cover is separated from a motor package including a motor controller according to one embodiment of the present invention, and FIGS. 2 and 3 are perspective views illustrating a state in which a first electronic control unit (ECU) and a second ECU, which are included in the motor controller according to one embodiment of the present invention, are separated when viewed from different angles.

A motor controller 3 according to one embodiment of the present invention is a controller configured to control a motor 1. More specifically, the motor controller according to one embodiment of the present invention may control any one or more of a rotating speed and a torque of the motor 1. In this case, the motor 1 may be applied to an electric power steering (EPS) system. That is, the motor 1 may generate an auxiliary steering force corresponding to any one or more of a steering angle and a torque detected when a driver manipulates a steering wheel.

Referring to FIG. 1, the motor controller 3 according to one embodiment of the present invention may be disposed at a side, which is opposite to an output shaft 11, of the motor 1 along an axis A extending in a longitudinal direction of the motor 1. In other words, the motor controller 3 according to one embodiment of the present invention may be disposed to be connected to the motor 1 at a side, which is opposite to the output shaft 11, of both sides of a motor housing 12.

Referring to FIGS. 1 to 3, the motor controller 3 according to one embodiment of the present invention includes a first ECU 31, a second ECU 32, a first heat radiation member 33, a second heat radiation member 34, and a cover 35.

The first ECU 31 receives power and a signal transmitted from an external device to control the motor 1. In this case, the external device may be a main ECU of a vehicle. In addition, in a case in which the motor 1 includes a dual-winding, the first ECU 31 may be considered to be connected to one winding of the dual-winding to control half of an output of the motor 1.

Figure 4:
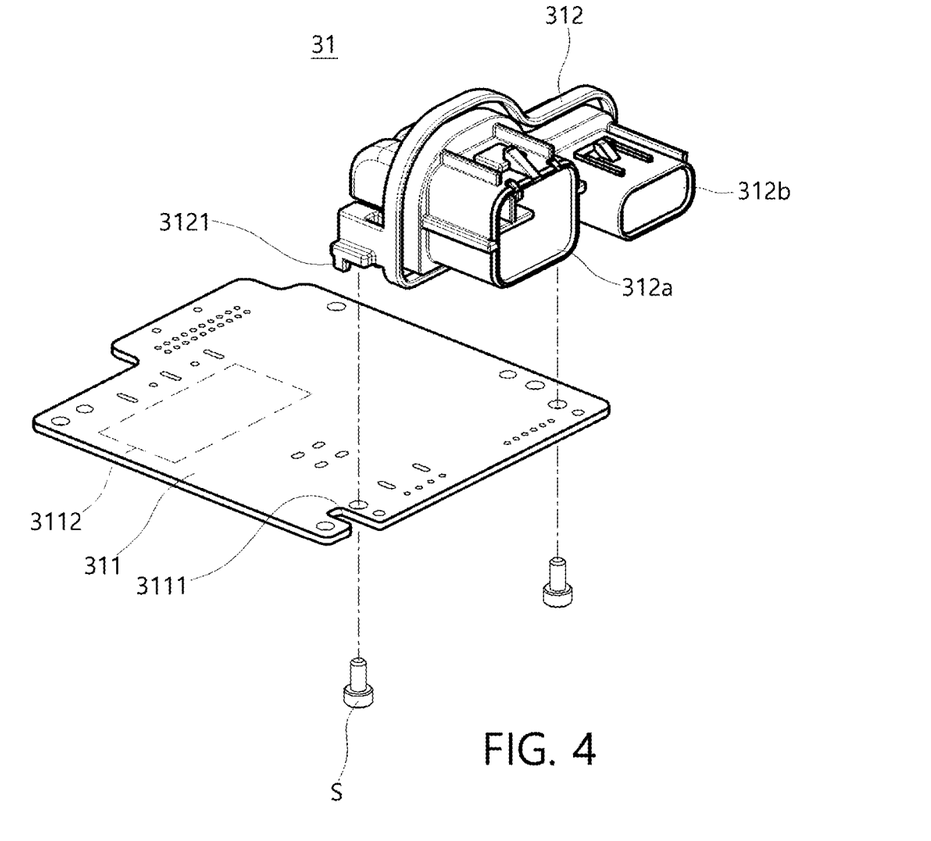
FIG. 4 is an exploded perspective view illustrating the first ECU of the motor controller according to one embodiment of the present invention.

Referring to FIG. 4, in one embodiment of the present invention, the first ECU 31 includes a first substrate 311 and a first connector 312.

The first substrate 311 may be formed as a printed circuit board (PCB). One end of the first substrate 311 is disposed close to an end portion, which is opposite to an output shaft 11, of the motor 1, and the first connector 312 is coupled to the other end thereof.

In one embodiment of the present invention, a first slit 3111 is formed at the other end of the first substrate 311 coupled to the first connector 312 such that a first identification member 3121 of the first connector 312 protrudes toward one surface of the first substrate 311. That is, the first identification member 3121 of the first connector 312 protrudes toward one surface of the first heat radiation member 33 through the first slit 3111 of the first substrate 311.

Various kinds of circuit elements for controlling the motor 1 are disposed on the first substrate 311. More specifically, the first substrate 311 may include a first power circuit 3112 and a first control circuit (not shown).

The first power circuit 3112 includes one or more power elements and is disposed on the first substrate 311. The first power circuit 3112 converts power supplied from an external device through the first connector 312 to suitable power to drive the motor 1.

The first power circuit 3112 may include a first power terminal connected to a first busbar 13 of the motor 1. In this case, the first busbar 13 may be a terminal connected to a first winding of the dual-winding of the motor 1.

The first power circuit 3112 is a main heating portion of the first ECU 31. Accordingly, a main target of heat radiation through the first heat radiation member 33 is the first power circuit 3112 as will be described below.

The first control circuit includes one or more control elements and is disposed on the first substrate 311. The first control circuit controls the first power circuit and the like based on a signal transmitted from an external device through the first connector 312 to control the motor 1.

The first control circuit generates relatively less heat than the first power circuit 3112. Accordingly, the first control circuit may also not be in direct contact with the first heat radiation member 33 as will be described below.

The first connector 312 includes the first identification member 3121 and is coupled to the first substrate 311. In one embodiment of the present invention, the first connector 312 is connected to a first wiring harness of the vehicle. In other words, the first connector 312 is a component forming the first ECU 31 and has a key code specification different from that of the second connector 322.

In one embodiment of the present invention, the first identification member 3121 is formed as a protrusion protruding toward one surface of the first heat radiation member 33. More specifically, the first identification member 3121 is formed as the protrusion protruding toward one surface of the first substrate 311 through the first slit 3111 formed in the other end of the first substrate 311.

Meanwhile, the first connector 312 includes a first input connector 312a and a first output connector 312b. External power and an external signal may be transmitted to the first substrate 311 through the first input connector 312a, and one or more pieces of position sensing information and torque information of the motor may be transmitted to an external device through the first output connector 312b.

The second ECU 32 receives power and a signal transmitted from an external device to control the motor 1. In this case, the external device may be a main ECU of the vehicle. In addition, in the case in which the motor 1 includes the dual-winding, the second ECU 32 may be considered to be connected to another winding, which is not connected to the first ECU 31, of the dual-winding of the motor 1 to control the remaining half output of the motor 1.

Figure 5:
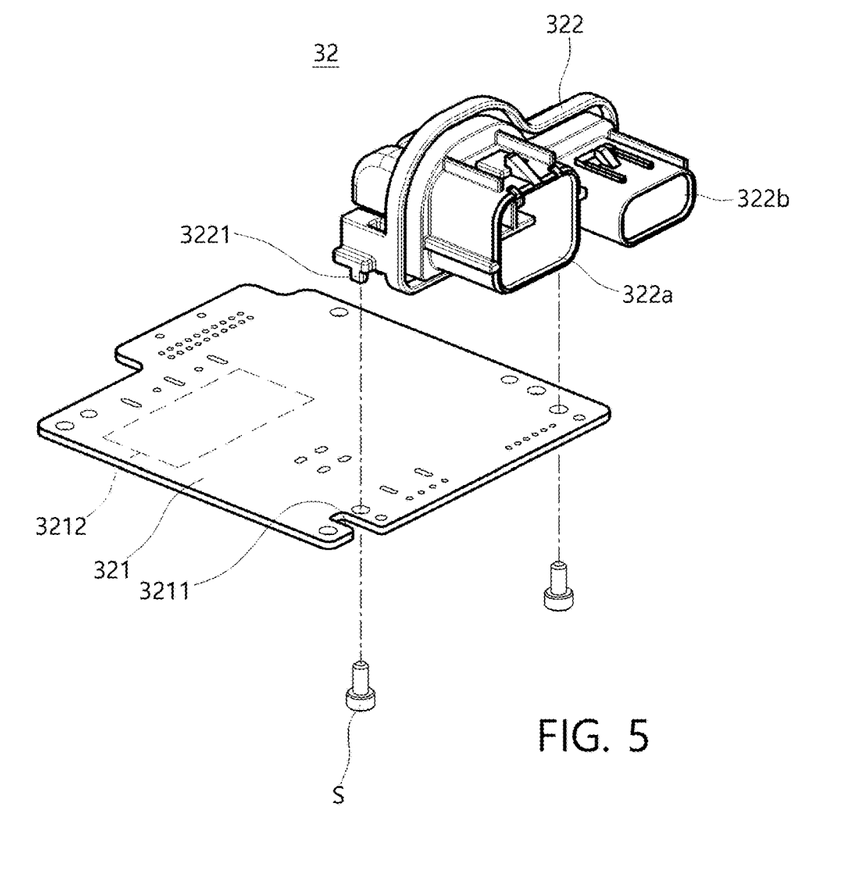
FIG. 5 is an exploded perspective view illustrating the second ECU of the motor controller according to one embodiment of the present invention.

Referring to FIG. 5, in one embodiment of the present invention, the second ECU 32 includes a second substrate 321 and a second connector 322.

The second substrate 321 may be provided as a PCB. One end of the second substrate 321 is disposed close to the end portion, which is opposite to the output shaft 11, of the motor 1, and the other end is coupled to the second connector 322.

In one embodiment of the present invention, a second slit 3211 is formed in the other end of the second substrate 321 coupled to the second connector 322 such that a second identification member 3221 of the second connector 322 protrudes toward one surface of the second substrate 321. That is, the second identification member 3221 of the second connector 322 protrudes toward the other surface of the first heat radiation member 33 through the second slit 3211 of the second substrate 321.

Various kinds of circuit elements are disposed on the second substrate 321 to control the motor 1. More specifically, the second substrate 321 may include a second power circuit 3212 and a second control circuit (not shown).

The second power circuit 3212 includes one or more power elements and is disposed on the second substrate 321. The second power circuit converts power supplied from an external device through the second connector 322 to suitable power to drive the motor 1.

The second power circuit 3212 may include a second power terminal connected to a second busbar 14 of the motor 1. In this case, the second busbar 14 may be a terminal connected to a second winding of the dual-winding of the motor 1.

The second power circuit 3212 is a main heating portion of the second ECU 32. Accordingly, a main target of heat radiation through the first heat radiation member 33 is the second power circuit 3212, like the first power circuit 3112.

The second control circuit includes one or more control elements and is disposed on the second substrate 321. The second control circuit controls the second power circuit and the like based on a signal transmitted from an external device through the second connector 322 to control the motor 1.

The second control circuit generates relatively less heat than the second power circuit 3212. Accordingly, the second control circuit may also not be in direct contact with the first heat radiation member 33.

The second connector 322 includes the second identification member 3221 which is different from the first identification member 3121 and is coupled to the second substrate 321. In one embodiment of the present invention, the second connector 322 is connected to a second wiring harness of the vehicle. In other words, the second connector 322 is a component forming the second ECU 32 and has a key code specification different from that of the first connector 312.

In one embodiment of the present invention, the second identification member 3221 is formed as a protrusion protruding toward the other surface of the first heat radiation member 33. More specifically, the second identification member 3221 is formed as the protrusion protruding toward one surface of the second substrate 321 through the second slit 3211 formed in the other end of the second substrate 321.

Figure 6:
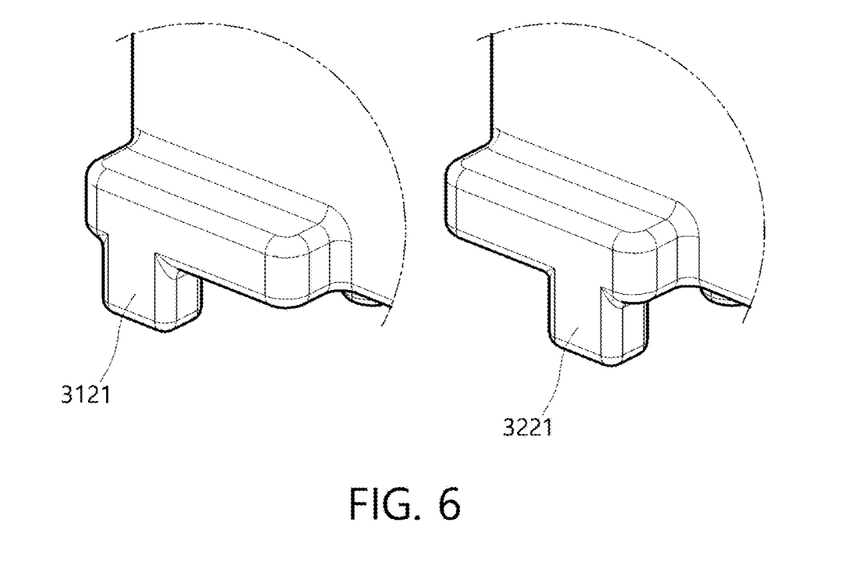
FIG. 6 is an enlarged view illustrating a first identification member and a second identification member of the motor controller according to one embodiment of the present invention.

Referring to FIG. 6, in one embodiment of the present invention, it may be seen that a shape of the second identification member 3221 is the same as a shape of the first identification member 3121 but positions thereof are different. That is, in one embodiment of the present invention, a difference between the second identification member 3221 and the first identification member 3121 is positions on the connectors.

Meanwhile, the second connector 322 includes a second input connector 322a and a second output connector 322b. External power and an external signal may be transmitted to the second substrate 321 through the second input connector 322a, and any one or more pieces of position sensing information and torque information of the motor may be transmitted to an external device through the second output connector 322b.

The first heat radiation member 33 is a plate member radiating heat of the first ECU 31 and the second ECU 32. In one embodiment of the present invention, the first ECU 31 is coupled to one surface of the first heat radiation member 33 and the second ECU 32 is coupled to the other surface thereof.

More specifically, one or more screw coupling parts 331a and 331b are formed on each of one surface and the other surface of the first heat radiation member 33, and the first substrate 311 and the second substrate 321 may be coupled using screws S. The screw coupling parts 331a and 331b may be formed to protrude to heights which are equal to or less than those of the first contact portion 333a and the second contact portion 333b.

The first heat radiation member 33 includes a first interference member 332a formed at a position at which the first interference member 332a is not interfered with by the first identification member 3121 but is interfered with by the second identification member 3221 such that the second ECU 32 is not coupled to one surface of the first heat radiation member 33. In one embodiment of the present invention, the first interference member 332a is formed as a protrusion formed on one surface of the first heat radiation member 33.

Figure 7:
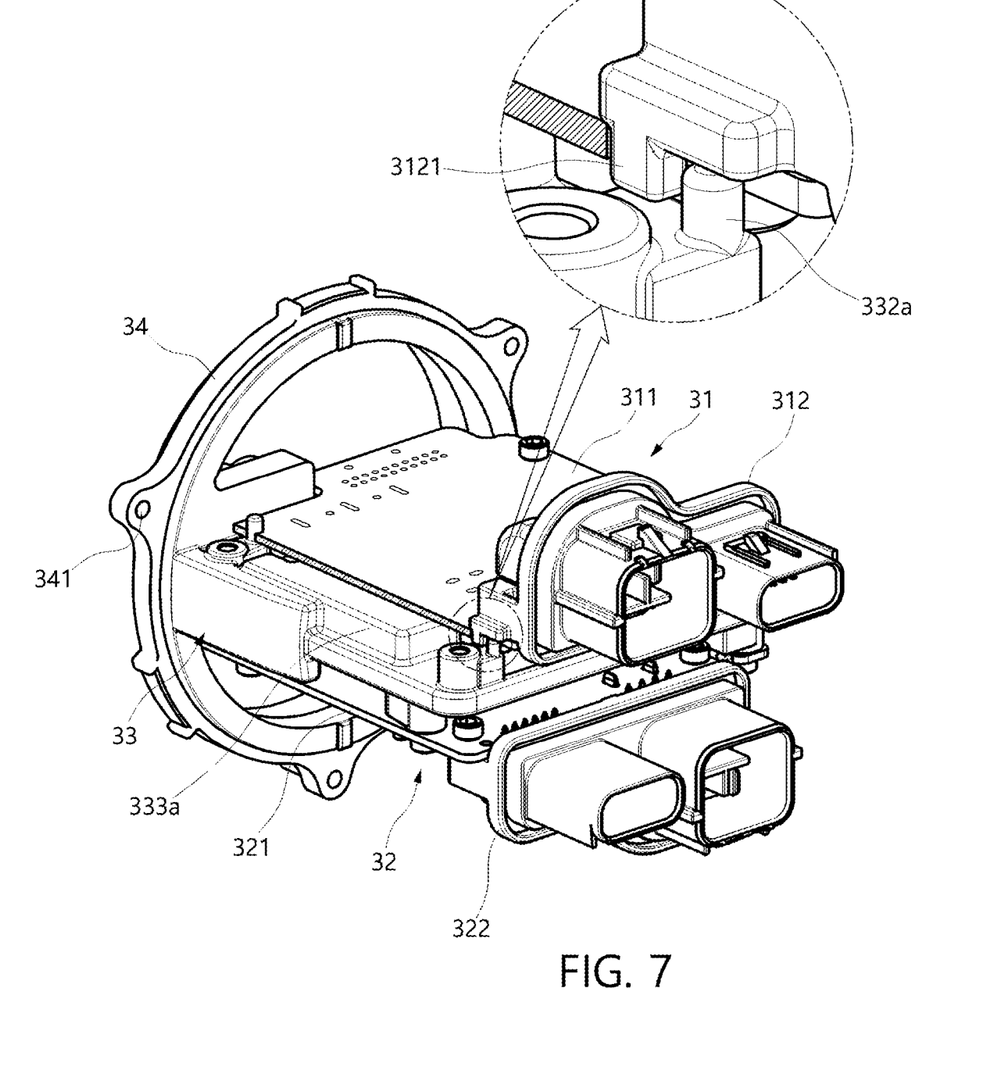
FIG. 7 is a perspective view illustrating a coupling state of the first ECU and a first heat radiation member in the motor controller according to one embodiment of the present invention.

In FIG. 7, a coupling state of the first ECU and the first heat radiation member in the motor controller according to one embodiment of the present invention is illustrated. Some parts of the first substrate 311 are omitted in FIG. 7 to clearly illustrate the coupling state of the first ECU 31 and the first heat radiation member 33.

Referring to FIG. 7, in one embodiment of the present invention, in the state in which the first ECU 31 is coupled to one surface of the first heat radiation member 33, the first identification member 3121 and the first interference member 332a are disposed close to each other side by side. In addition, a height of protrusion of the first interference member 332a is equal to or less than a height of the first contact portion 333a.

Figure 8:
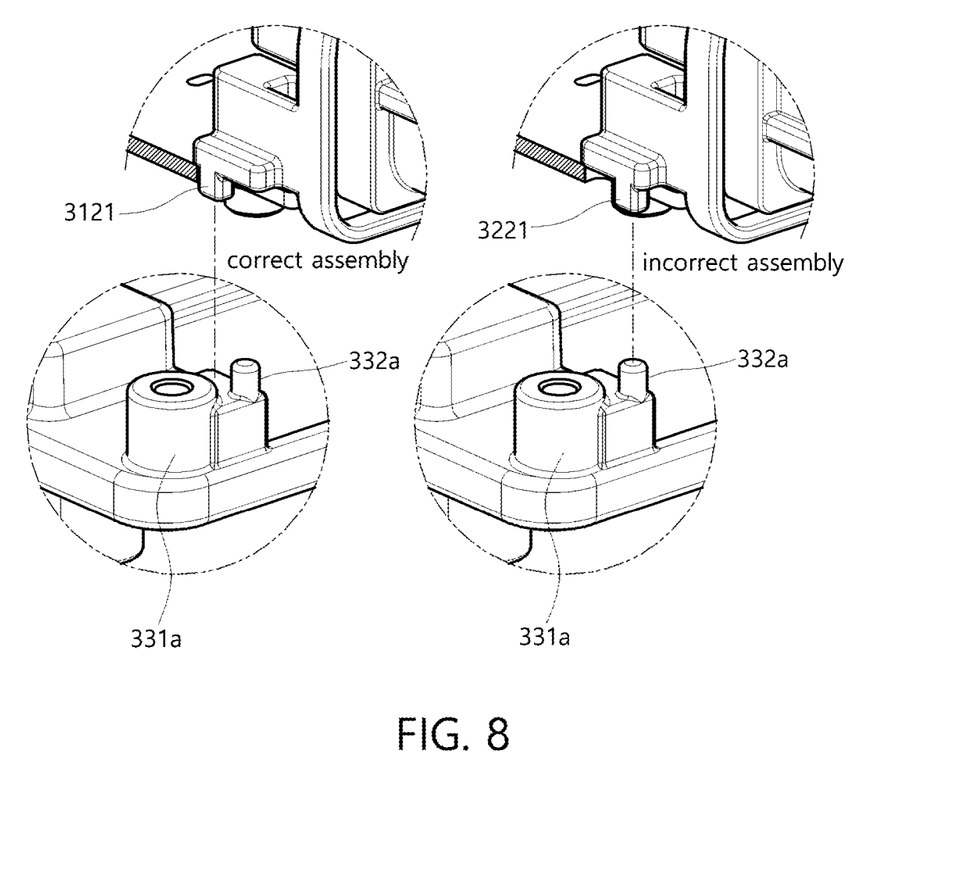
FIG. 8 is a view illustrating a correct coupling state and an incorrect assembly state between the first ECU and the first heat radiation member in the motor controller according to one embodiment of the present invention.

The first interference member 332a is formed at the position at which the first interference member 332a is not interfered with by the first identification member 3121 but is interfered with by the second identification member 3221. Accordingly, as shown in FIG. 8, the first ECU 31 may be coupled to one surface of the first heat radiation member 33, but the second ECU 32 may not be coupled to one surface of the first heat radiation member 33. Accordingly, incorrect assembly is prevented.

In addition, the first heat radiation member 33 further includes a second interference member 332b formed at a position at which the second interference member 332b is not interfered with by the second identification member 3221 but is interfered with by the first identification member 3121 such that the first ECU 31 is not coupled to the other surface of the first heat radiation member 33. In one embodiment of the present invention, the second interference member 332b is formed as a protrusion formed on the other surface of the first heat radiation member 33.

Figure 9:
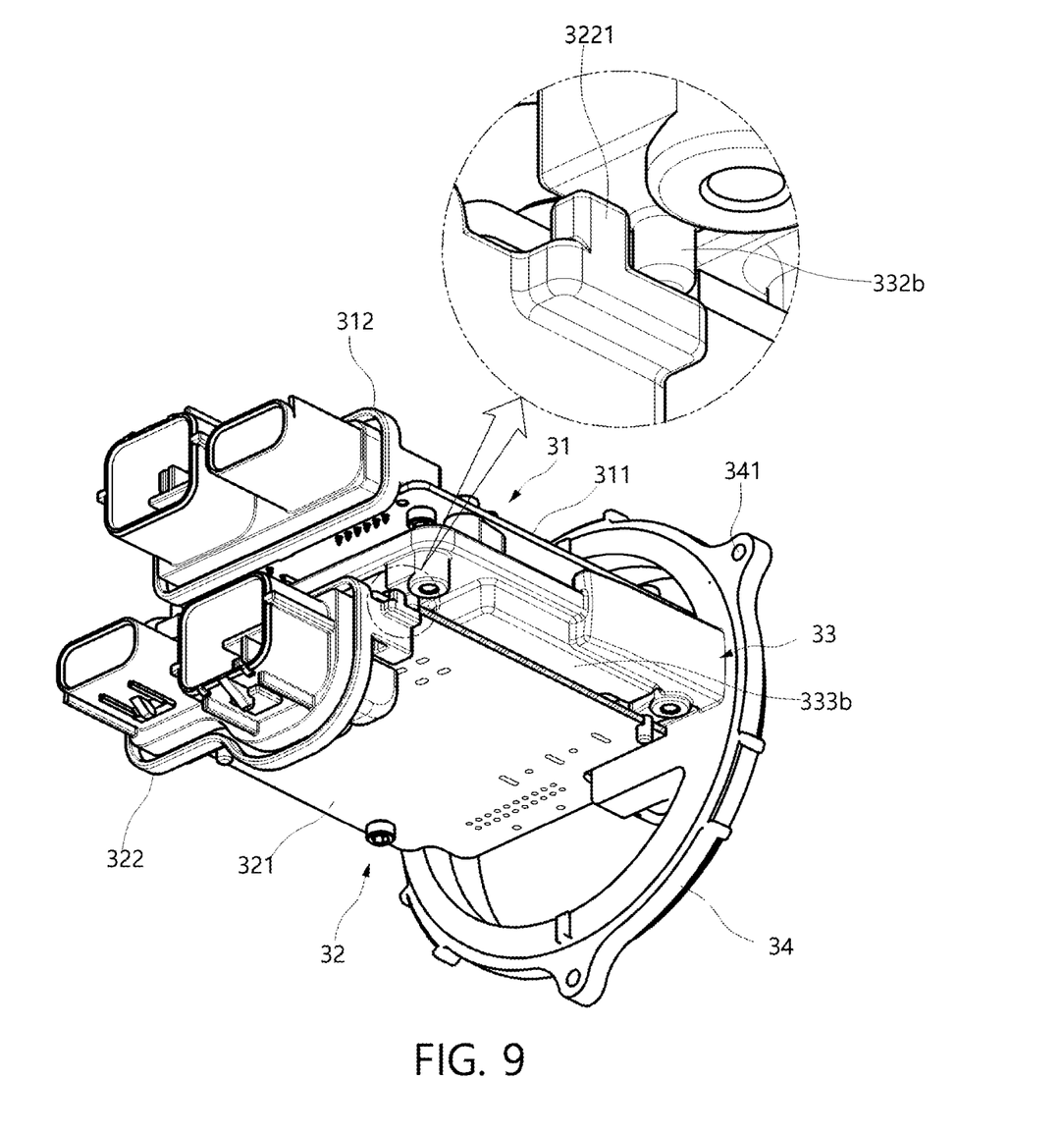
FIG. 9 is a perspective view illustrating a coupling state of the second ECU and the first heat radiation member in the motor controller according to one embodiment of the present invention.

In FIG. 9, a coupling state of the second ECU and the first heat radiation member in the motor controller according to one embodiment of the present invention is illustrated. Some parts of the second substrate 321 are omitted in FIG. 9 to clearly illustrate the coupling state of the second ECU 32 and the first heat radiation member 33.

Referring to FIG. 9, in one embodiment of the present invention, in the state in which the second ECU 32 is coupled to the other surface of the first heat radiation member 33, the second identification member 3221 and the second interference member 332b are disposed close to each other side by side. In addition, a height of protrusion of the second interference member 332b is equal to or less than a height of the second contact portion 333b.

The second interference member 332b is positioned at the position at which the second interference member 332b is not interfered with by the second identification member 3221 but is interfered with by the first identification member 3121. Accordingly, the second ECU 32 can be coupled to the other surface of the first heat radiation member 33, but the first ECU 31 cannot be coupled to the other surface of the first heat radiation member 33 due to a reason described with reference to FIG. 8.

In one embodiment of the present invention, the first heat radiation member 33 includes a first contact portion 333a formed to protrude from one surface in contact with the first substrate 311 to be in contact with the first power circuit 3112 and a second contact portion 333b formed to protrude from the other surface in contact with the second substrate 321 to be in contact with the second power circuit 3212.

As described above, the first power circuit 3112 and the second power circuit 3212 are main heat sources of the first ECU 31 and the second ECU 32. The first contact portion 333a and the second contact portion 333b are in direct contact with the first power circuit 3112 and the second power circuit 3212 generating a large amount of heat to smoothly radiate heat.

Referring to FIGS. 2 and 3, the first contact portion 333a and the second contact portion 333b are formed such that at least a portion thereof does not overlap when viewed in a vertical direction. Due to such a structure, heat radiation areas are distributed so that heat radiation efficiency can be improved.

The second heat radiation member 34 is a member disposed close to the end portion, which is opposite to the output shaft 11, of the motor 1 and connected to the first heat radiation member 33. In one embodiment of the present invention, the second heat radiation member 34 is formed to have an annular shape. In addition, the first heat radiation member 33 is connected to an inner circumferential surface of the second heat radiation member 34. Accordingly, heat transferred through the first heat radiation member 33 can be discharged to the outside through the second heat radiation member 34.

In one embodiment of the present invention, the second heat radiation member 34 is coupled to the end portion, which is opposite to the output shaft 11, of both sides of the motor housing 12. More specifically, one or more screw holes are provided in an end portion of the motor housing 12 formed to have a cylindrical shape, and the second heat radiation member 34 includes screw holes 341 at positions corresponding to screw holes 121. Since screws are inserted into and coupled to the screw holes 341 of the second heat radiation member 34 and the screw holes of the motor housing 12, the second heat radiation member 34 can be coupled to the motor 1.

Meanwhile, a sealing member may be disposed between the second heat radiation member 34 and the motor housing 12 to secure air tightness. For example, the sealing member may be an O-ring.

In one embodiment of the present invention, the first heat radiation member 33 and the second heat radiation member 34 may be integrally formed. In addition, a material of the first heat radiation member 33 and the second heat radiation member 34 may be an aluminum material having an advantage in a mechanical property, heat conductivity, and the like.

The cover 35 protects the first ECU 31, the second ECU 32, the first heat radiation member 33, and the like from external foreign substances and the like. In one embodiment of the present invention, the cover 35 is connected to the motor housing 12 and formed to have a cylindrical shape, one side of the cover 35 is open in a longitudinal direction, and a first through hole portion 351a and a second through hole portion 351b through which the first connector 312 and the second connector 322 pass are formed at the other side thereof.

Meanwhile, in one embodiment of the present invention, a motor position sensing unit may be disposed close to the end portion, which is opposite to the output shaft 11, of the motor 1. The first ECU 31 and the second ECU 32 may be disposed to be connected to the motor position sensing unit, and the first ECU 31 and the second ECU 32 receive sensing information from the motor position sensing unit and transmit the sensing information to an external device through the first output connector 312b and the second output connector 322b.

According to one embodiment of the present invention, incorrect assembly of an electronic control unit can be effectively prevented using an identification member provided in the electronic control unit and an interference member provided in a heat radiation member.

According to one embodiment of the present invention, since components of a motor controller are disposed along a shaft extending in a longitudinal direction of a motor at a side, which is opposite to an output shaft, of the motor, spatial efficiency can be secured and a size of a package can be minimized.

While the embodiments of the present invention have been described above, the spirit of the present invention is not limited to the embodiment proposed in this specification, and it will be understood by those skilled in the art that other embodiments may be easily suggested by adding, changing, and deleting components, and the other embodiments will fall within the spiritual range of the present invention.

What is claimed is:

1. A motor controller comprising:
    a first electronic control unit which comprises a first substrate and a first connector having a first identification member and coupled to the first substrate and controls a motor;
    a second electronic control unit which comprises a second substrate and a second connector having a second identification member different from the first identification member and coupled to the second substrate and controls the motor; and
    a first heat radiation member of which one surface is coupled to the first electronic control unit and the other surface is coupled to the second electronic control unit and which comprises a first interference member formed at a position at which the first interference member is not interfered with by the first identification member but is interfered with by the second identification member such that the one surface is not coupled to the second electronic control unit and has a plate shape.

2. The motor controller of claim 1, wherein:
    the first identification member is formed as a protrusion protruding toward the one surface of the first heat radiation member; and
    the first interference member is formed as a protrusion formed on the one surface of the first heat radiation member.

3. The motor controller of claim 2, wherein the first identification member and the first interference member are disposed close to each other side by side in a state in which the first electronic control unit is coupled to the one surface of the first heat radiation member.

4. The motor controller of claim 1, wherein the first heat radiation member further comprises a second interference member formed at a position at which the second interference member is not interfered with by the second identification member but is interfered with by the first identification member such that the other surface is not coupled to the first electronic control unit.

5. The motor controller of claim 4, wherein:
    the second identification member is formed as a protrusion protruding toward the other surface of the first heat radiation member; and
    the second interference member is formed as a protrusion formed on the other surface of the first heat radiation member.

6. The motor controller of claim 5, wherein the second identification member and the second interference member are disposed close to each other side by side in a state in which the second electronic control unit is coupled to the other surface of the first heat radiation member.

7. The motor controller of claim 1, wherein the first heat radiation member is disposed at a side, which is opposite to an output shaft, of the motor along a shaft extending in a longitudinal direction of the motor.

8. The motor controller of claim 7, wherein:
    one end of the first substrate and one end of the second substrate are disposed close to an end portion, which is opposite to the output shaft, of the motor;
    the first connector is coupled to the other end of the first substrate; and
    the second connector is coupled to the other end of the second substrate.

9. The motor controller of claim 7, further comprising a second heat radiation member coupled to an end portion, which is opposite to the output shaft, of the motor and connected to the first heat radiation member.

10. The motor controller of claim 9, wherein the second heat radiation member is formed to have an annular shape.

11. The motor controller of claim 1, wherein:
    the first substrate comprises a first power circuit;
    the second substrate comprises a second power circuit; and
    the first heat radiation member comprises a first contact portion formed to protrude from the one surface in contact with the first substrate to be in contact with the first power circuit and a second contact portion formed to protrude from the other surface in contact with the second substrate to be in contact with the second power circuit.

12. The motor controller of claim 11, wherein the first contact portion and the second contact portion are formed so that at least a part does not overlap when viewed in a perpendicular direction.

* * * * *